(12) United States Patent
Behrends et al.

(10) Patent No.: US 7,737,757 B2
(45) Date of Patent: Jun. 15, 2010

(54) LOW POWER LEVEL SHIFTING LATCH CIRCUITS WITH GATED FEEDBACK FOR HIGH SPEED INTEGRATED CIRCUITS

(75) Inventors: Derick Gardner Behrends, Rochester, MN (US); Travis Reynold Hebig, Rochester, MN (US); Daniel Mark Nelson, Rochester, MN (US); Jesse Daniel Smith, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 48 days.

(21) Appl. No.: 12/178,071

(22) Filed: Jul. 23, 2008

(65) Prior Publication Data
US 2010/0019824 A1  Jan. 28, 2010

(51) Int. Cl.
*H03K 19/0175* (2006.01)
(52) U.S. Cl. .......................... 327/333; 326/62
(58) Field of Classification Search ................ 327/318, 327/319, 323, 327, 328, 333, 211, 212; 326/62, 326/63, 80
See application file for complete search history.

(56) References Cited

U.S. PATENT DOCUMENTS

| 5,892,385 | A  | * | 4/1999 | Hashiguchi | 327/333 |
| 6,351,173 | B1 | * | 2/2002 | Ovens et al. | 327/333 |
| 6,563,357 | B1 |   | 5/2003 | Hsu et al. |  |
| 7,443,223 | B2 | * | 10/2008 | Bajkowski et al. | 327/333 |
| 7,525,367 | B2 | * | 4/2009 | Behrends et al. | 327/333 |

* cited by examiner

*Primary Examiner*—Hai L Nguyen
(74) *Attorney, Agent, or Firm*—Joan Pennington

(57) ABSTRACT

Low power level shifter latch circuits with gated feedback for high speed integrated circuits, and a design structure on which the subject circuit resides are provided. A latch input stage operating in a domain of a first voltage supply receives a data input responsive to being enabled by predefined clock signals. A latch storage element coupled to the latch input stage includes a latch output stage operating in a domain of a second voltage supply provides a data output having a voltage level corresponding to the second voltage supply. The latch storage element includes a level shifting device providing level shifting from the first supply level to the second voltage supply level. The latch storage element includes feedback gate devices receiving the predefined clock signals to gate feedback to the latch input stage when data is being written to the latch input stage.

15 Claims, 4 Drawing Sheets

LOW POWER LEVEL SHIFTING LATCH CIRCUITS WITH GATED FEEDBACK FOR HIGH SPEED INTEGRATED CIRCUITS

FIELD OF THE INVENTION

The present invention relates generally to the data processing field, and more particularly, relates to low power level shifter latch circuits with gated feedback for high speed integrated circuits, and a design structure on which the subject circuit resides.

DESCRIPTION OF THE RELATED ART

In integrated circuits, multiple power supply domains are often used to combat sensitivities of some circuits to voltage reduction. In circuits with multiple voltages, level-shifters are often needed for functionality and circuit robustness.

Level shifter circuits are utilized in integrated circuits for changing the voltage of a signal from a first voltage to a second voltage, such as from a high to a low operating voltage, or from a low to a high operating voltage.

Many level shifting latches have been proposed. Problems with many existing level shifting latches include slow speed operations, limiting or eliminating use for high speed applications. Also many existing level shifting latches require many devices to define the level shifting latch, and consume high power.

For example, U.S. Pat. No. 6,563,357 issued May 13, 2003 to Hsu et al. discloses a level converting latch 200, which is illustrated in FIG. 2 of the above-identified patent. The level converting latch 200 includes cross-coupled inverters 232 and 234 to store the data, and dual N-channel field effect transistor (NFET) pulldown devices 220 and 222 to write data to the latch. Problems with this configuration are limited high-speed application due to available operational speed and many devices are used to implement the level converting latch 200. Also, this configuration has a different delay when writing a zero than writing a one.

Other prior art level shifting latch circuits use cross-coupled P-channel field effect transistors (PFETs) to store the data and to provide the level shifting function. Partially due to the lack of feedback gating, the cross-coupled PFET configuration is slower and consumes more power, than other known level shifting latch arrangements.

A need exists for an improved low power level shifter latch circuits with gated feedback for high speed integrated circuits.

SUMMARY OF THE INVENTION

Principal aspects of the present invention are to provide low power level shifter latch circuits with gated feedback for high speed integrated circuits, and a design structure on which the subject circuit resides. Other important aspects of the present invention are to provide such low power level shifter latch circuits with gated feedback for high speed integrated circuits substantially without negative effect and that overcome many of the disadvantages of prior art arrangements.

In brief, low power level shifter latch circuits with gated feedback for high speed integrated circuits, and a design structure on which the subject circuit resides are provided. A latch input stage operating in a domain of a first voltage supply receives a data input responsive to being enabled by predefined clock signals. A latch storage element coupled to the latch input stage includes a latch output stage operating in a domain of a second voltage supply provides a data output having a voltage level corresponding to the second voltage supply. The latch storage element includes a level shifting device providing level shifting from the first supply level to the second voltage supply level. The latch storage element includes feedback gate devices receiving the predefined clock signals to gate feedback to the latch input stage when data is being written to the latch input stage.

In accordance with features of the invention, the latch storage element includes leakage current control devices to turn off an input stage leakage current switch device, and to turn off a storage element leakage current switch device when the output of the latch input stage is at the second voltage supply level.

In accordance with features of the invention, the latch input stage includes an inverting input stage, such as a tri-state inverting input stage. The inverting input stage includes a transistor stack of a pair of series connected P-channel field effect transistors (PFETs), the leakage current switch device, and a pair of series connected N-channel field effect transistors (NFETs) connected between the first voltage supply level and ground potential. A clock signal is applied to one of the series connected N-channel field effect transistors (NFETs) and a complement clock signal is applied to one of series connected P-channel field effect transistors (PFETs). When the clock signal is high and the complement clock signal is low, the output of the tri-state inverting input stage is the inverted data input. When the clock signal is low, the output of the tri-state inverting input stage is disconnected, or high-impedance (high-Z) state.

In accordance with features of the invention, the latch input stage includes a non-inverting pass gate input stage. The non-inverting pass gate input stage includes a pair of series connected PFETs connected in parallel with an NFET. A clock signal is applied to the NFET and a complement clock signal is applied to one of series connected P-channel field effect transistors (PFETs). When the clock signal is high and the complement clock signal is low, the output of the non-inverting pass gate input stage is the data input.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

In accordance with features and other advantages of the invention, enhanced level shifter circuits 100, 300 are provided that have excellent power and performance characteristics. The novel level shifting latch circuits 100, 300 provide faster performance and a greater range of level shifting functionality as compared to prior art arrangements.

Figure 1:
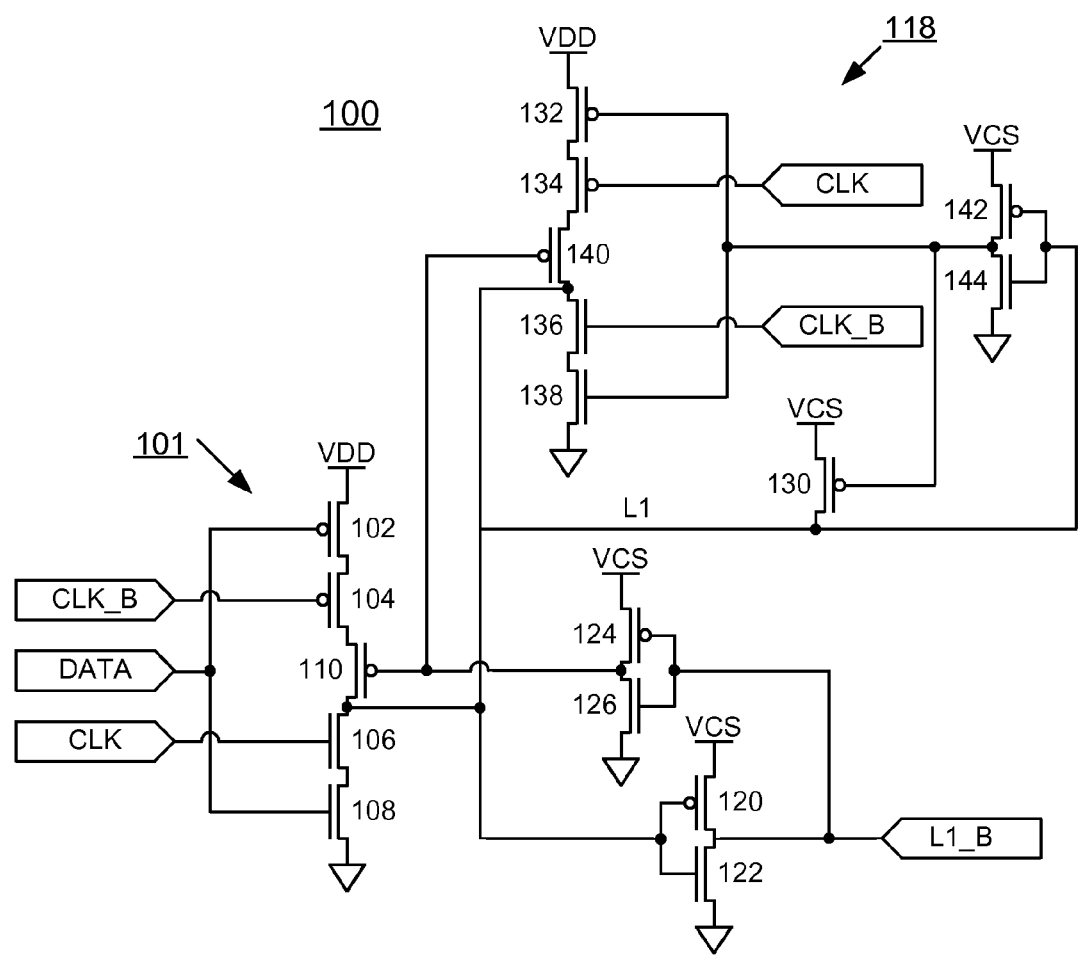
FIG. 1 is a schematic diagram illustrating a first level shifter latch circuit in accordance with the preferred embodiment.

Having reference now to the drawings, in FIG. 1, there is shown a first level shifter latch circuit generally designated by the reference character 100 in accordance with a preferred embodiment.

Level shifter latch circuit 100 is a low power level shifter latch circuit including gated feedback for high speed integrated circuits. Level shifter latch circuit 100 includes a first voltage supply VDD and a second voltage supply VCS, where the second voltage supply VCS is the higher voltage supply.

Level shifter latch circuit 100 includes a latch input stage generally designated by the reference character 101 operating in the domain of a first voltage supply VDD receiving a data input DATA responsive to being enabled by predefined clock signals CLK, CLK_B where CLK_B is the complement clock signal of the clock signal CLK.

The latch input stage 101 includes latch input stage includes an inverting input stage, such as a tri-state inverting input stage. The inverting input stage includes a transistor stack connected between the first voltage supply level VDD and ground potential including a pair of series connected P-channel field effect transistors (PFETs) 102, 104, a pair of series connected N-channel field effect transistors (NFETs) 106, 108, connected together with an input stage leakage current switch device defined by PFET 110.

A clock signal CLK is applied to one of the series connected N-channel field effect transistors (NFETs) 106 and a complement clock signal CLK_B is applied to one of series connected P-channel field effect transistors (PFETs) 104. When the clock signal CLK is high and the complement clock signal CLK_B is low, the output of the tri-state inverting input stage 101 at a node labeled L1 is the inverted data input. When the clock signal CLK is low, the output of the tri-state inverting input stage is disconnected, or high-impedance (high-Z) state.

Level shifter latch circuit 100 includes a latch storage element generally designated by the reference character 118 coupled to the latch input stage 101. The latch storage element 118 includes a latch output stage defined by a series connected PFET 120 and NFET 122 connected between the second voltage supply VCS and ground and providing a data output at node L1_B having a voltage level corresponding to the second voltage supply VCS.

The latch storage element 118 includes leakage current control devices implemented with an inverter defined by a series connected PFET 124 and NFET 126 connected between the second voltage supply VCS and ground. The gate input to PFET 124 and NFET 126 is the data output at node L1_B of the level shifter latch circuit 100.

The latch storage element 118 includes a level shifting device PFET 130 providing level shifting from the first supply level VDD to the second voltage supply level VCS.

The latch storage element 118 includes a transistor stack connected between the first voltage supply level VDD and ground potential including a pair of series connected P-channel field effect transistors (PFETs) 132, 134, a pair of series connected N-channel field effect transistors (NFETs) 136, 138, connected together with a latch storage element leakage current switch device defined by PFET 140.

The latch storage element 118 includes an inverter providing control input to the level shifting PFET 130 that is defined by a series connected PFET 142 and NFET 144 connected between the second voltage supply VCS and ground. The gate input to PFET 142 and NFET 144 is the data output of the input stage 101 at node L1. The inverted output of PFET 142 and NFET 144 is applied to a respective gate of level shifting PFET 130, storage element transistor stack PFET 132, and NFET 138. The output of the input stage 101 at node L1 is connected to the storage element transistor stack between the latch storage element leakage current switch PFET 140 and NFET 138.

The latch storage element 118 includes feedback gate devices PFET 134, and NFET 136 receiving the respective clock signals CLK, CLK_B to gate feedback to the latch input stage 101 when data is being written to the latch input stage. This means that the input data to the level shifter latch circuit 100 does not need to compete with feedback from the storage element 118 and the input data can be written fast.

The inverted output of PFET 124 and NFET 126 is applied to a gate of PFET 110 to turn off an input stage leakage current switch PFET 110 and is applied to a gate of a storage element leakage current switch device PFET 140 to turn off the storage element leakage current switch device PFET 140 when node L1 is at the second voltage supply VCS. Latch input stage PFET 110 and storage element leakage current switch device PFET 140 eliminate leakage from the higher voltage supply VCS to the lower voltage supply VDD when node L1 is at the higher voltage supply VCS, by using the feedback provided by PFET 124 and NFET 126 to completely turn off PFETs 110 and 140.

Figure 2:
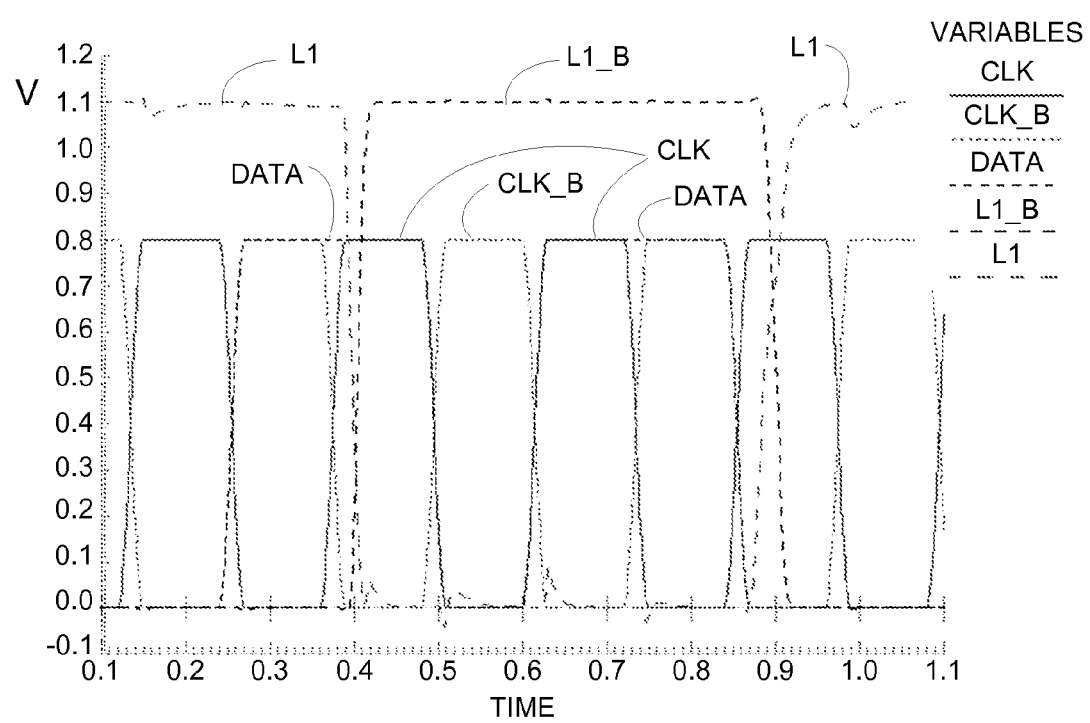
FIG. 2 is a graph illustrating example operation of the first level shifter latch circuit of FIG. 1 in accordance with the preferred embodiment.

Referring now to FIG. 2, there is shown example operation of the level shifter latch circuit 100. In FIG. 2, time is shown along the horizontal axis and voltage is shown along the vertical axis in volts (V). An example input signal is indicated by DATA, clocks signals CLK, CLK_B, and an example output signal at node L1_B is indicated by L1_B together with a latch input stage output signal at node L1 that is indicated by L1.

Figure 3:
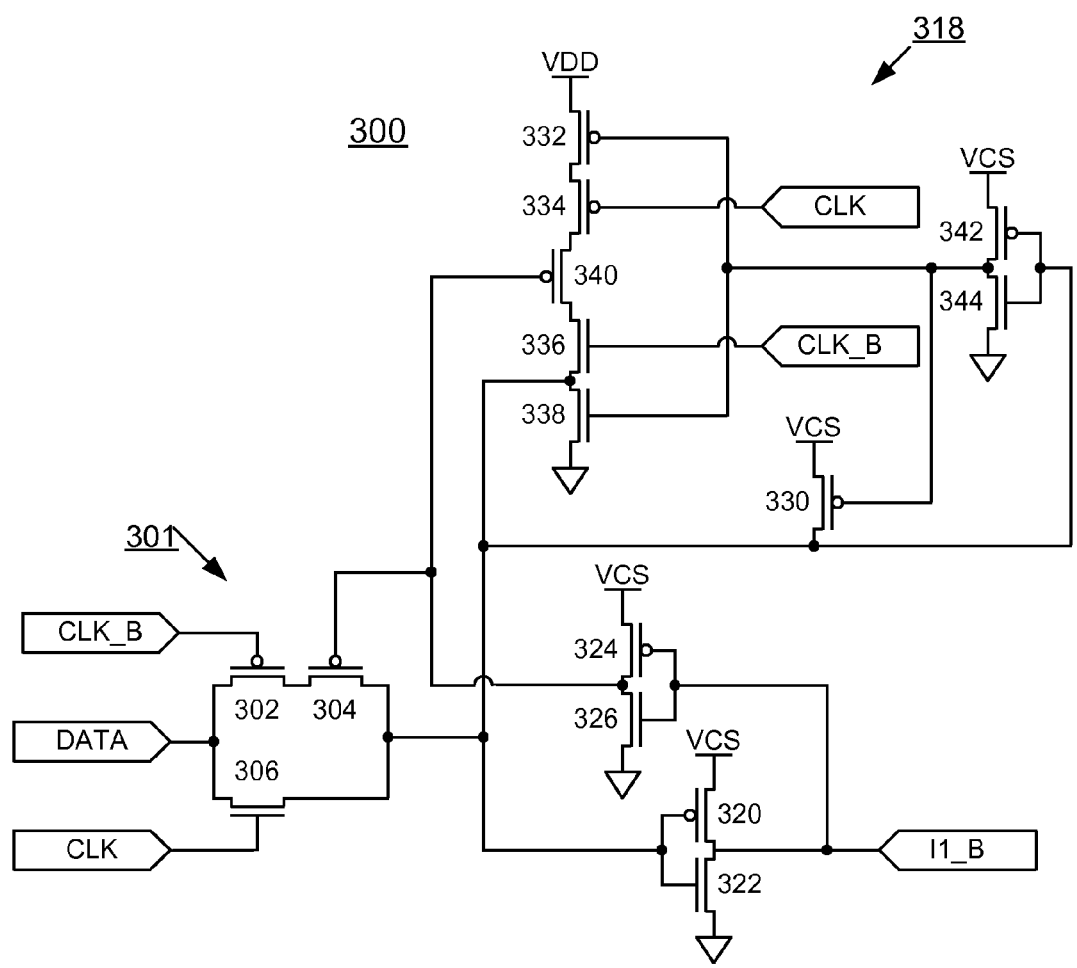
FIG. 3 is a schematic diagram illustrating a second level shifter latch circuit in accordance with the preferred embodiment.

Referring now to FIG. 3, there is shown a second level shifter latch circuit generally designated by the reference character 300 in accordance with the preferred embodiment.

Level shifter latch circuit 300 is another low power level shifter latch circuit including gated feedback for high-speed integrated circuits. Level shifter latch circuit 300 includes a first voltage supply VDD and a second voltage supply VCS, where the second voltage supply VCS is the higher voltage supply.

Level shifter latch circuit 300 includes a latch input stage generally designated by the reference character 301 operating in the domain of a first voltage supply VDD receiving a data input DATA responsive to being enabled by predefined clock signals CLK, CLK_B where CLK_B is the complement clock signal of the clock signal CLK.

The latch input stage 301 includes a non-inverting pass gate input stage. The non-inverting pass gate input stage 301 includes a pair of series connected PFETs 302, 304 connected in parallel with an NFET 306. A clock signal CLK is applied to the NFET 306 and a complement clock signal CLK_B is applied to one of series connected P-channel field effect transistors (PFETs) 302. When the clock signal is high and the complement clock signal is low, the output of the non-inverting pass gate input stage is the data input. PFET 304 implements an input stage leakage current switch device.

Level shifter latch circuit 300 includes a latch storage element generally designated by the reference character 318 coupled to the latch input stage 301. The latch storage element 318 includes a latch output stage defined by a series connected PFET 320 and NFET 322 connected between the second voltage supply VCS and ground and providing a data output at node L1_B having a voltage level corresponding to the second voltage supply VCS.

The latch storage element 318 includes leakage current control devices implemented with an inverter defined by a series connected PFET 324 and NFET 326 connected between the second voltage supply VCS and ground. The gate input to PFET 324 and NFET 326 is the data output at node L1_B of the level shifter latch circuit 300.

The latch storage element 318 includes a level shifting device PFET 330 providing level shifting from the first supply level VDD to the second voltage supply level VCS.

The latch storage element 318 includes a transistor stack connected between the first voltage supply level VDD and ground potential including a pair of series connected P-channel field effect transistors (PFETs) 332, 334, a pair of series connected N-channel field effect transistors (NFETs) 336, 338, connected together with a latch storage element leakage current switch device defined by PFET 340.

The latch storage element 318 includes an inverter providing control input to the level shifting PFET 330 that is defined by a series connected PFET 342 and NFET 344 connected between the second voltage supply VCS and ground. The gate input to PFET 342 and NFET 344 is the data output of the input stage 303 at node L1. The inverted output of PFET 342 and NFET 344 is applied to a respective gate of level shifting PFET 330, storage element transistor stack PFET 332, and NFET 338. The output of the input stage 301 at node L1 is connected to the storage element transistor stack between the latch storage element leakage current switch PFET 340 and NFET 336.

The latch storage element 318 includes feedback gate devices PFET 334, and NFET 336 receiving the respective clock signals CLK, CLK_B to gate feedback to the latch input stage 301 when data is being written to the latch input stage 301. This means that the input DATA applied to PFET 302, NFET 306 of the level shifter latch circuit 300 does not need to compete with feedback from the storage element 318 and the input data can be written fast.

The inverted output of PFET 324 and NFET 326 is applied to a gate of PFET 304 to turn off an input stage leakage current switch PFET 304 and is applied to a gate of a storage element leakage current switch device PFET 340 to turn off the storage element leakage current switch device PFET 340 when node L1 is at the second voltage supply VCS. Latch input stage PFET 304 and storage element leakage current switch device PFET 340 eliminate leakage from the higher voltage supply VCS to the lower voltage supply VDD when node L1 is at the higher voltage supply VCS, by using the feedback provided by PFET 324 and NFET 326 to completely turn off PFETs 304 and 340.

Figure 4:
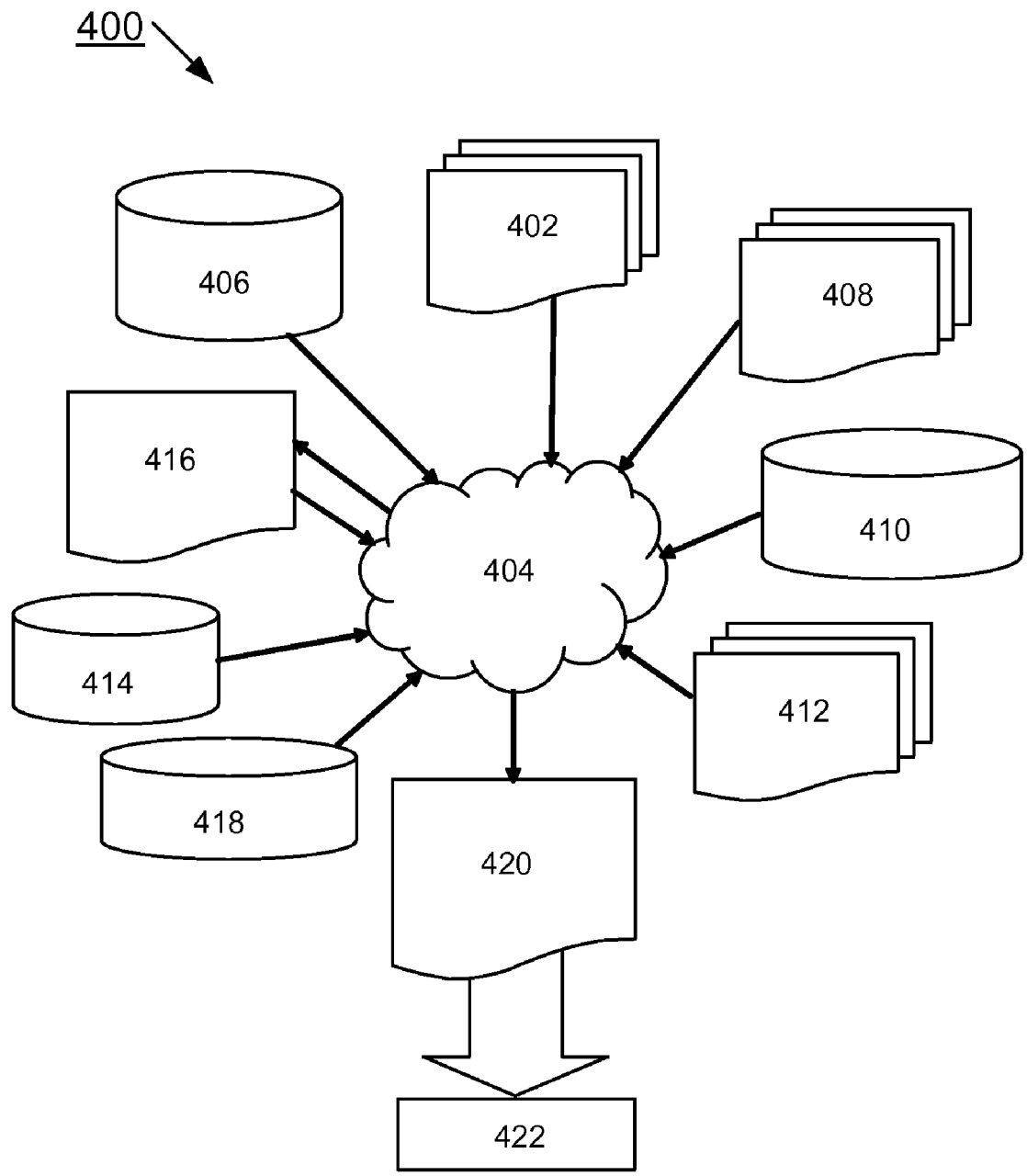
FIG. 4 is a flow diagram of a design process used in semiconductor design, manufacturing, and/or test.

FIG. 4 shows a block diagram of an example design flow 400. Design flow 400 may vary depending on the type of IC being designed. For example, a design flow 400 for building an application specific IC (ASIC) may differ from a design flow 400 for designing a standard component. Design structure 402 is preferably an input to a design process 404 and may come from an IP provider, a core developer, or other design company or may be generated by the operator of the design flow, or from other sources. Design structure 402 comprises circuit 100, and circuit 300 in the form of schematics or HDL, a hardware-description language, for example, Verilog, VHDL, C, and the like. Design structure 402 may be contained on one or more machine readable medium. For example, design structure 402 may be a text file or a graphical representation of circuit 100. Design process 404 preferably synthesizes, or translates, circuit 100, and circuit 300 into a netlist 406, where netlist 406 is, for example, a list of wires, transistors, logic gates, control circuits, I/O, models, etc. that describes the connections to other elements and circuits in an integrated circuit design and recorded on at least one of machine readable medium. This may be an iterative process in which netlist 406 is resynthesized one or more times depending on design specifications and parameters for the circuit.

Design process 404 may include using a variety of inputs; for example, inputs from library elements 408 which may house a set of commonly used elements, circuits, and devices, including models, layouts, and symbolic representations, for a given manufacturing technology, such as different technology nodes, 32 nm, 45 nm, 90 nm, and the like, design specifications 410, characterization data 412, verification data 414, design rules 416, and test data files 418, which may include test patterns and other testing information. Design process 404 may further include, for example, standard circuit design processes such as timing analysis, verification, design rule checking, place and route operations, and the like. One of ordinary skill in the art of integrated circuit design can appreciate the extent of possible electronic design automation tools and applications used in design process 404 without deviating from the scope and spirit of the invention. The design structure of the invention is not limited to any specific design flow.

Design process 404 preferably translates an embodiment of the invention as shown in FIGS. 1, and 3 along with any additional integrated circuit design or data (if applicable), into a second design structure 420. Design structure 420 resides on a storage medium in a data format used for the exchange of layout data of integrated circuits, for example, information stored in a GDSII (GDS2), GL1, OASIS, or any other suitable format for storing such design structures. Design structure 420 may comprise information such as, for example, test data files, design content files, manufacturing data, layout parameters, wires, levels of metal, vias, shapes, data for routing through the manufacturing line, and any other data required by a semiconductor manufacturer to produce an embodiment of the invention as shown in FIGS. 1 and 3. Design structure 420 may then proceed to a stage 422 where, for example, design structure 420 proceeds to tape-out, is released to manufacturing, is released to a mask house, is sent to another design house, is sent back to the customer, and the like.

While the present invention has been described with reference to the details of the embodiments of the invention shown in the drawing, these details are not intended to limit the scope of the invention as claimed in the appended claims.

What is claimed is:

1. A level shifter latch circuit comprising:
   a latch input stage operating in a domain of a first voltage supply receives a data input responsive to being enabled by predefined clock signals;
   a latch storage element coupled to said latch input stage;
   said latch storage element including a latch output stage operating in a domain of a second voltage supply provides a data output having a voltage level corresponding to the second voltage supply;
   said latch storage element including a level shifting device providing level shifting from the first supply level to the second voltage supply level;
   said latch storage element including feedback devices receiving the predefined clock signals to gate feedback to said latch input stage responsive to data being written to said latch input stage.

2. The level shifter latch circuit as recited in claim 1 wherein said latch output stage includes a first inverter defined by a first series connected P-channel field effect transistor (PFET) and N-channel field effect transistor (NFET).

3. The level shifter latch circuit as recited in claim 2 wherein said latch storage element includes a transistor stack of a pair of series connected P-channel field effect transistors (PFETs), a leakage current switch device, and a pair of series connected N-channel field effect transistors (NFETs) connected between the first voltage supply level and ground potential, and a second inverter defined by a second series connected P-channel field effect transistor (PFET) and N-channel field effect transistor (NFET).

4. The level shifter latch circuit as recited in claim 3 wherein said feedback devices receiving the predefined clock signals to gate feedback to said latch input stage responsive to data being written to said latch input stage include a respective one of each of said pair of series connected P-channel field effect transistors (PFETs) and said pair of series connected N-channel field effect transistors (NFETs), and a clock signal is applied to said respective one of said series connected P-channel field effect transistors (PFETs) and a complement clock signal is applied to said respective one of series connected N-channel field effect transistors (NFETs).

5. The level shifter latch circuit as recited in claim 3 wherein said latch input stage includes an input stage leakage current switch device and said latch storage element includes leakage current control devices to turn off said input stage leakage current switch device and to turn off said storage element leakage current switch device.

6. The level shifter latch circuit as recited in claim 1 wherein said latch input stage includes a tri-state inverting input stage.

7. The level shifter latch circuit as recited in claim 1 wherein said latch input stage includes an inverting input stage.

8. The level shifter latch circuit as recited in claim 7 wherein said inverting input stage includes a transistor stack of a pair of series connected P-channel field effect transistors (PFETs), a leakage current switch device, and a pair of series connected N-channel field effect transistors (NFETs) connected between the first voltage supply level and ground potential.

9. The level shifter latch circuit as recited in claim 8 wherein said inverting input stage includes a clock signal is applied to one of the series connected N-channel field effect transistors (NFETs) and a complement clock signal is applied to one of series connected P-channel field effect transistors (PFETs), and responsive to said clock signal being high and said complement clock signal being low, an output of said inverting input stage is an inverted data input.

10. The level shifter latch circuit as recited in claim 9 wherein said output of the tri-state inverting input stage is a high-impedance state responsive to said clock signal being low and said complement clock signal being high.

11. The level shifter latch circuit as recited in claim 1 wherein said latch input stage includes a non-inverting pass gate input stage.

12. The level shifter latch circuit as recited in claim 11 wherein said non-inverting pass gate input stage includes a pair of series connected P-channel field effect transistors (PFETs), said series connected PFETs connected in parallel with an N-channel field effect transistors (PFET).

13. The level shifter latch circuit as recited in claim 12 wherein said non-inverting pass gate input stage includes a clock signal applied to said NFET and a complement clock signal applied to one of series connected P-channel field effect transistors (PFETs); and responsive to the clock signal being high and the complement clock signal being low, the data input provided at an output of said non-inverting pass gate input stage.

14. The level shifter latch circuit as recited in claim 12 wherein one of series connected P-channel field effect transistors (PFETs) of said non-inverting pass gate input stage is an input stage leakage current switch device and said latch storage element includes leakage current control devices to turn off said input stage leakage current switch device and to turn off a storage element leakage current switch device.

15. The level shifter latch circuit as recited in claim 1 wherein said level shifting device providing level shifting from the first supply level to the second voltage supply level includes a P-channel field effect transistor (PFET) connected between an output of said input stage and said second voltage supply, said level shifting PFET receiving a gate input of an inverted output of said input stage.

* * * * *